United States Patent [19]
Tseng

[11] Patent Number: 5,670,407
[45] Date of Patent: Sep. 23, 1997

[54] METHOD OF FABRICATING A TOOTHED-SHAPE CAPACITOR NODE IN A SEMICONDUCTOR DRAM CIRCUIT

[75] Inventor: Horng-Huei Tseng, Hsinchu, Taiwan

[73] Assignee: Vanguard International Semiconductor Corporation, Hsinchu, Taiwan

[21] Appl. No.: 791,507

[22] Filed: Jan. 30, 1997

[51] Int. Cl.⁶ .................................................. H01L 21/8242
[52] U.S. Cl. ............................ 437/52; 437/60; 437/919
[58] Field of Search ................................ 437/47, 52, 60, 437/919

[56] References Cited

U.S. PATENT DOCUMENTS 5,204,280  4/1993  Dhong et al. .................. 437/52
5,393,373  2/1995  Jun et al. ....................... 437/52
5,622,889  4/1997  Yoo et al. ..................... 438/397

*Primary Examiner*—Jey Tsai
*Attorney, Agent, or Firm*—Christensen O'Connor Johnson & Kindness PLLC

[57] ABSTRACT

The present invention is a method of fabricating a toothed-shape capacitor node in a semiconductor DRAM circuit. This invention utilizes dot silicon as an etching mask. Next, the polysilicon is oxidized and removed to form trenches in the bottom storage of the capacitor. Thus, a toothed-shape capacitor node is formed in semiconductor circuit.

17 Claims, 4 Drawing Sheets

METHOD OF FABRICATING A TOOTHED-SHAPE CAPACITOR NODE IN A SEMICONDUCTOR DRAM CIRCUIT

FIELD OF THE INVENTION

The present invention relates to methods for forming semiconductor integrated circuits, and more particularly, to a method for forming toothed-shape capacitor nodes.

BACKGROUND OF THE INVENTION

In recent years there has been a dramatic increase in the packing density of DRAMs. Large DRAM devices are normally silicon based, and each cell typically embodies a single MOS field effect transistor with its source connected to a storage capacitor. This large integration of DRAMs has been accomplished by a reduction in individual cell size. However, the reduction in cell size results in a decrease in storage capacitance leading to reliability drawbacks, such as a lower signal to noise ratio and undesirable signal problems. The desired large scale integration in DRAM devices along with reliable operation can be achieved by using DRAM storage capacitors with a high storage capacitance relative to its cell area.

Efforts to maintain or increase the storage capacitance in memory cells with greater packing densities have included the use of a stacked capacitor design in which the capacitor cell uses the space over the MOSFET device area for the capacitor plates. In a recent prior art DRAM, one of the two electrodes of a storage capacitor is formed to have a three-dimensional structure. This makes the capacitance larger by 30% to 40% than that of a two-dimensional storage capacitor having the same size as the three-dimensional one.

For example, a three-dimensional stacked capacitor is disclosed in U.S. Pat. No. 5,053,351. The storage node plate of this capacitor has an E-shaped cross-section. In another example, a hemispherical-grain (HSG) polysilicon storage node has been proposed (see "A New Cylindrical Capacitor Using Hemispherical-Grain Si for 256 Mb DRAMs", H. Watanabe et al., Microelectronics Research Laboratories, NEC Corporation). This memory cell provides a large storage capacitance by increasing the effective area of a simple storage node. However, the complex capacitor shapes tend to be difficult to fabricate and the standard processes need at least two masks for the complex capacitor shapes, and more particularly, for the toothed-shape capacitor node. Therefore, there is a need for a capacitor node with a high surface area that is simple to manufacture.

SUMMARY OF THE INVENTION

A method for forming a toothed-shaped capacitor node on a semiconductor substrate is disclosed. The method comprises the steps of forming a polysilicon layer over said semiconductor substrate; forming a dielectric layer on said polysilicon layer; forming dot silicon on said dielectric layer; removing said dielectric layer left uncovered by said dot polysilicon; oxidizing said dot silicon and said polysilicon layer uncovered by said second dielectric layer to form a poly-oxide layer; removing said poly-oxide layer to form trenches in said polysilicon layer; removing said dielectric layer; and patterning and etching said polysilicon layer to form a capacitor node.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
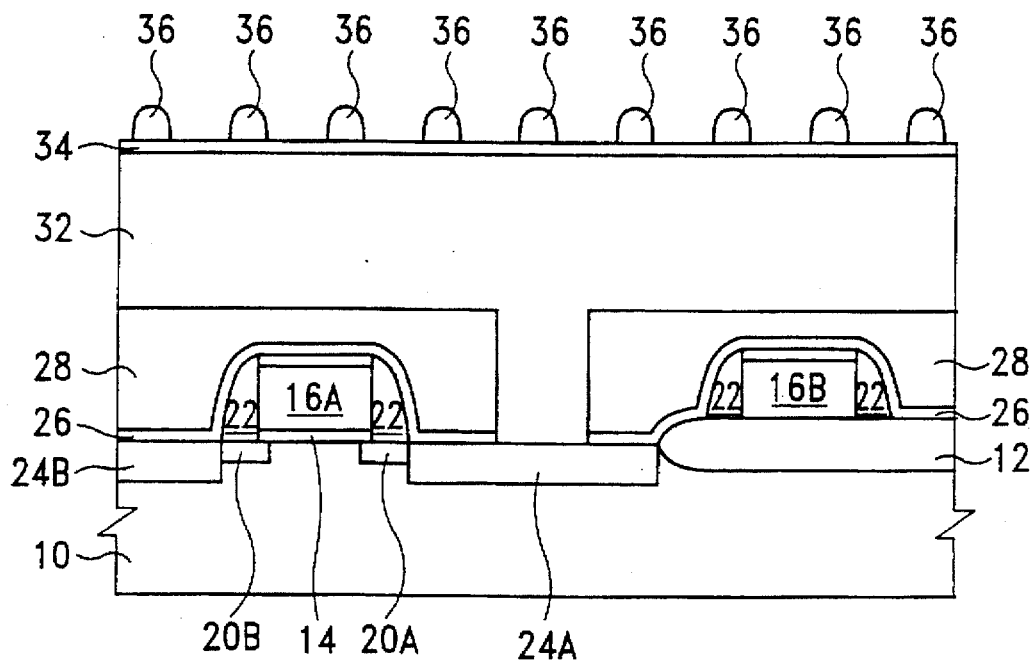
FIGS. 1–7 are cross section views of a semiconductor wafer illustrating various stages of forming a toothed-shape capacitor node according to one embodiment of the present invention.

Referring to FIG. 1, a single crystal substrate 10 with a <100> crystallographic orientation is provided. In this embodiment adapted for DRAM fabrication, metal-oxide-semiconductor field effect transistors (MOSFETs), word lines and bit lines are formed in and on the substrate 10 in any suitable manner well known in the art.

In one embodiment, the word lines and bit lines are formed as follows. Thick field oxide (FOX) regions 12 are formed to provide isolation between devices on the substrate 10. The FOX regions 12 is created in a conventional manner. In this embodiment, the FOX regions 12 are formed via standard photolithography and dry etching steps to define the FOX regions 12 using a silicon nitride layer formed on the substrate. The exposed portions of the substrate are then subjected to thermal oxidation in an oxygen-steam environment to grow the FOX region 12 to a thickness of about 4000–6000 angstrom. The silicon nitride layer is then removed. Next, a silicon dioxide layer 14 is created on the top of surface of the substrate 10 to serve as the gate oxide for subsequently a formed metal oxide silicon field effect transistors. In this embodiment, the silicon dioxide layer is formed by using an oxygen-steam ambient, at a temperature of about 850°–1000° C. Alternatively, the oxide layer may be formed using any suitable oxide chemical compositions and procedures. In this embodiment, the silicon dioxide layer is formed to a thickness of approximately 100 angstroms.

A first polysilicon layer is then formed over the FOX regions 12 and the silicon dioxide layer 14 using a low pressure chemical vapor deposition (LPCVD) process. The first polysilicon layer is doped in order to form a conductive gate for the MOSFET structure. In this embodiment, the first polysilicon layer has a thickness of about 500–2000 angstroms and is doped with phosphorus dopants at a concentration of about $10^{20}$–$10^{21}$ ions/cm$^2$. A tungsten silicide layer is formed on the first polysilicon layer to improve interconnection between the gate polysilicon and subsequently formed metal interconnects. Next, standard photolithography and etching process are performed to form gate structures 16A and word lines 16B. Active regions 20A, 20B are formed, using well-known processes to implant appropriate impurities in those regions and activate the impurities. Sidewall spacers 18 are subsequently formed on the sidewalls of the first polysilicon layer. Thereafter, active regions 24A, 24B (i.e., MOSFET's source and drain) are formed, using well-known processes to implant appropriate impurities in those regions and activate the impurities. Those skilled in the art of DRAM fabrication can modify this embodiment to form lightly doped drain (LDD) structures.

Then a first dielectric layer 26 is deposited on the gate structures 16A, word line 16B and the substrate 10 for isolation. The first dielectric layer 26, in the preferred embodiment, is composed of undoped oxide formed using a standard chemical vapor deposition process to a thickness of about 1000–2000 angstroms.

A second dielectric layer 28 is subsequently formed on the first dielectric layer 26. The second dielectric layer 28 can be formed of any suitable material such as, for example, BPSG. Preferably, the second dielectric layer 28 is formed using a conventional chemical vapor deposition process. The thickness of the second dielectric layer 28 is about 5000 angstroms, but can be any suitable thickness in the range of 3000 to 8000 angstroms. The second dielectric layer 28 is then planarized to improve the topography for the next processing step. Then, the first dielectric layer 26 and the second dielectric layer 28 is patterned and etched to form contact windows over the source/drain regions.

Standard processes are then used to form and pattern a photoresist layer (not shown) on the second dielectric layer 28 to define contact holes over selected source/drain regions 24. The photoresist layer leaves uncovered the contact holes, which are then etched through the second dielectric layer 28, the first dielectric layer 26 to expose a portion of the selected source/drain regions 24. In this embodiment, a standard patterning and etching process is performed to form the contact hole to have the minimum width supported by the photolithography process. The planarization process performed on the second dielectric layer 28 facilitates the formation of the minimum width contact hole.

A second polysilicon layer 32 is then formed on the second dielectric layer 28 and in the contact hole. The second polysilicon layer 32 is formed using a conventional LPCVD process to completely fill the contact holes. The thickness of the second polysilicon layer 32 on the top surface of the second dielectric layer 28 is about 3000–8000 angstroms. The second polysilicon layer 32 is doped with phosphorus dopants with a concentration of about $10^{20}$–$10^{21}$ ions/cm$^2$ to increase conductivity. Any suitable method may be used to doped the polysilicon such as, for example, in-situ doping.

Next, a nitride layer 34 is formed on the second polysilicon layer 32. In this embodiment, the nitride layer 34 is formed using any suitable conventional process. The thickness of the nitride layer 34 is about 100 to 400 angstroms. A dot silicon 36 layer is then formed on the nitride layer 34. In this embodiment, the dot silicon 36 layer can be deposited by any means such as hemispherical grained-Si or single Si crystal. The dot silicon 36 is formed using well-known processes. For example, the dot silicon 36 can be formed using a seeding method or traditional HSG deposition process but control in initial pgase reaction. Alternatively, the dot silicon 36 can be formed using conventional chemical vapor deposition method and etching method. In this embodiment, the diameter of the dot silicon 36 is about 50 to 500 angstroms and the spacing between the dot silicon is about 100 to 1000 angstroms.

Figure 2:
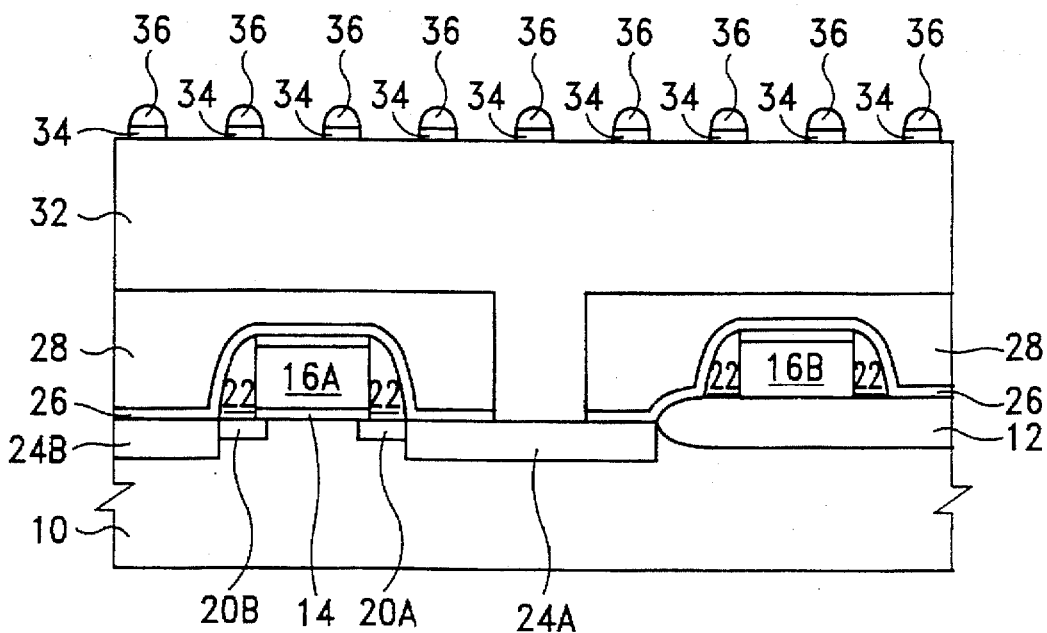

Next, the nitride layer 34 left uncovered by the dot silicon 36 is removed using an etching process. Preferably, the etching process uses an oxide etchant to remove the nitride layer 34. The dot silicon 36 serves as an etching mask. The resulting structure is shown in the FIG. 2.

Figure 3:
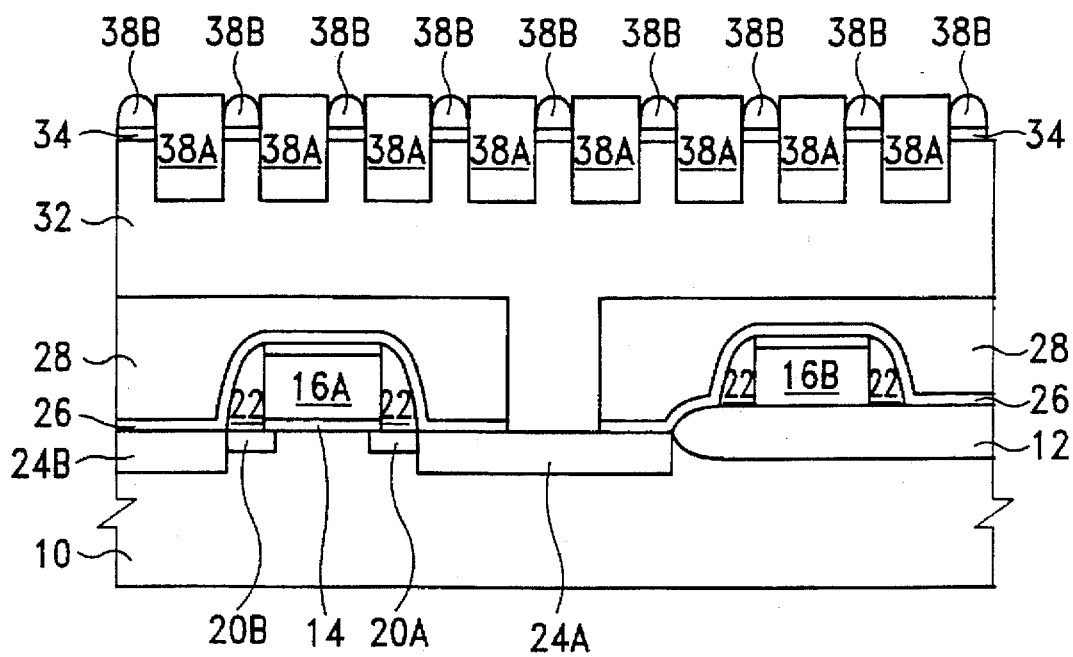

Turning to FIG. 3, the dot silicon 36 and the exposed second polysilicon 32 layer is thermally oxidized to form poly-oxide layer 38A, 38B. The poly-oxide layer 38A is formed on the second polysilicon 32 not covered by the nitride layer 34. The poly-oxide layer 38B is formed on the nitride layer 34 due to the oxidation of the dot silicon 36. The nitride layer 34 prevents oxidation of the underlying second polysilicon layer 32. In this embodiment, the poly-oxide layer 38A and 38B may be formed by using a dry oxidation method performed in an oxygen-vapor ambient, at a temperature between about 700° to 900° C. The thickness of the poly-oxide layer is controlled by the time of the oxidation process. In the preferred embodiment, the thickness of the poly-oxide layer 38B is about 200–400 angstroms and the thickness of the poly-oxide layer 38A is about 2000–7000 angstroms.

Figure 4:
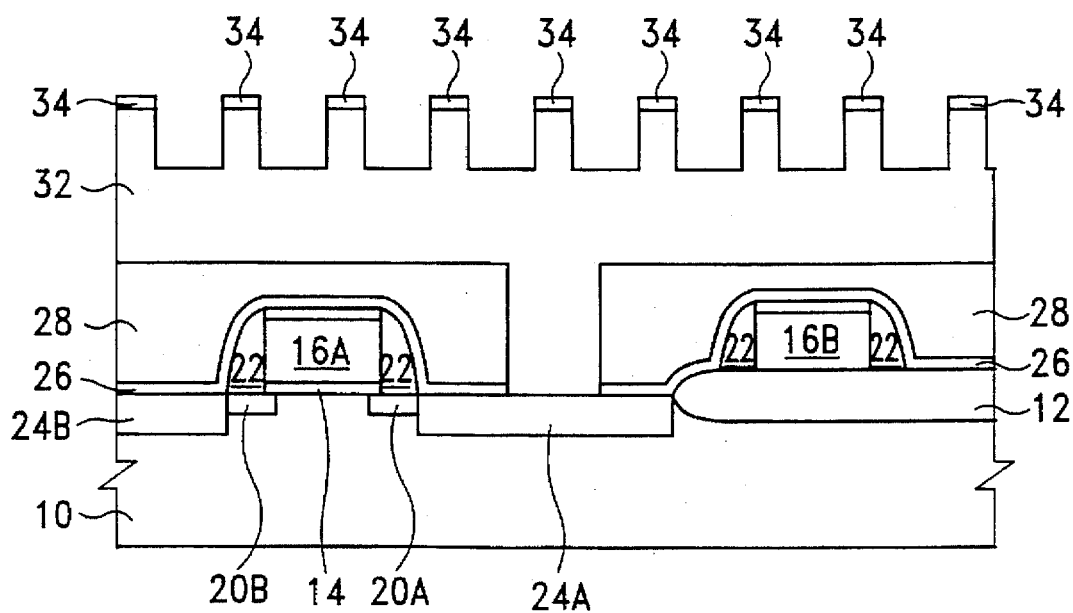

FIG. 4 illustrates a next stage of one embodiment of the present invention. An etching process is performed to remove the poly-oxide layer 38A, 38B. In the preferred embodiment, the etching process can be any suitable etching process such as wet etch or dry etch. The resulting structure is shown in FIG 4.

Figure 5:
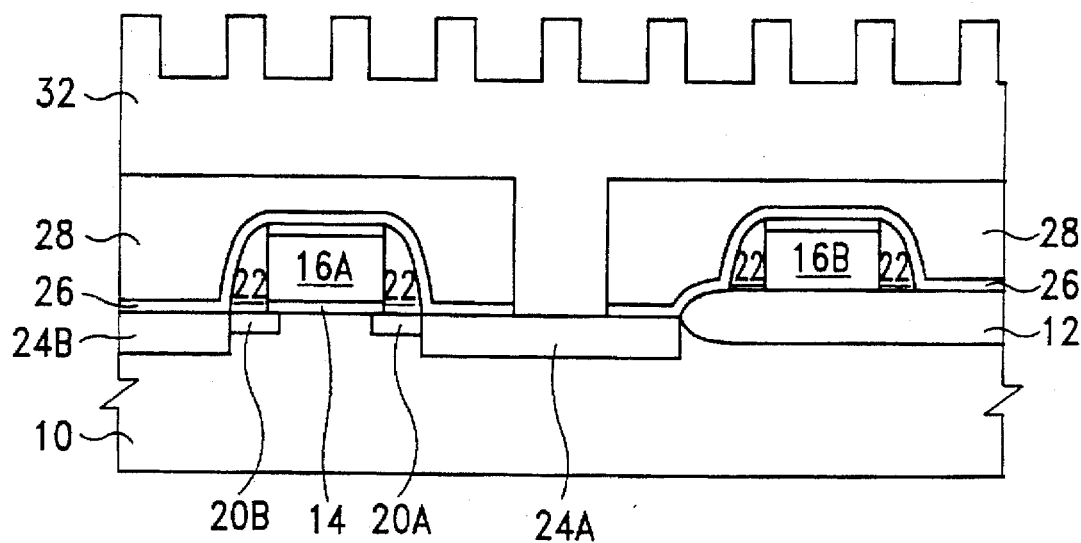

Turning now to FIG. 5, the nitride layer 34 is removed. An etching process is performed to remove the nitride layer 34. In this embodiment, the etching process is performed by any suitable etching process. For example, etching the nitride layer 34 may be performed by using a plasma etching process. A wet etching process using a $H_3PO_4$ solution may also be performed to etch the nitride layer 34. Then, the second polysilicon layer 32 with a toothed-shape surface is formed. The resulting structure is shown in the FIG. 5.

Figure 6:
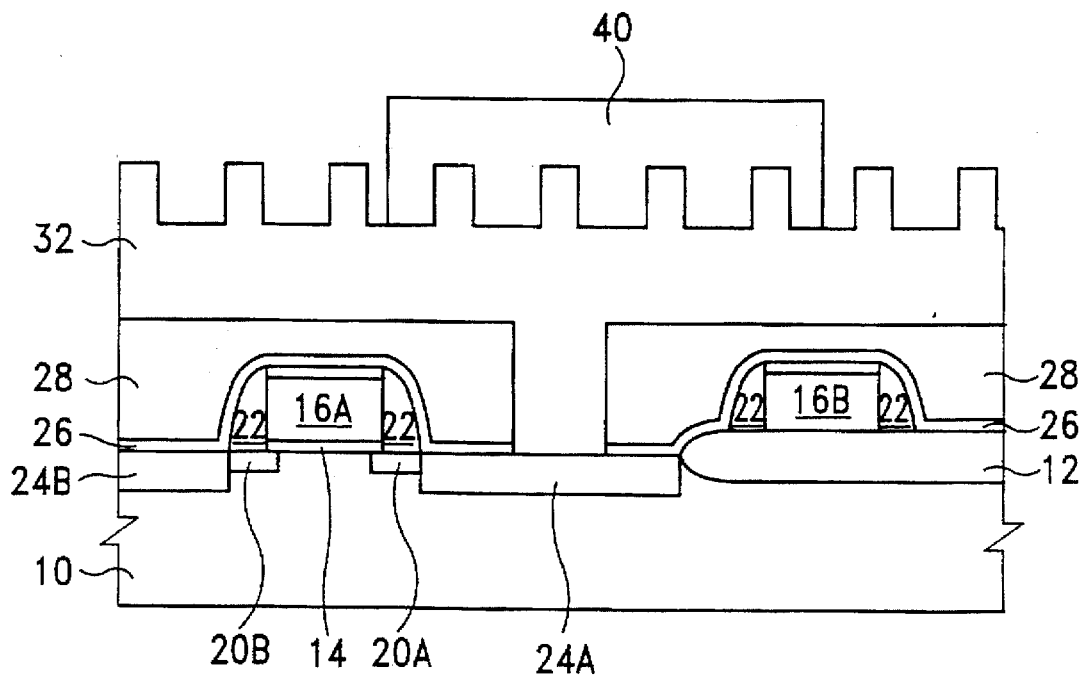
Figure 7:
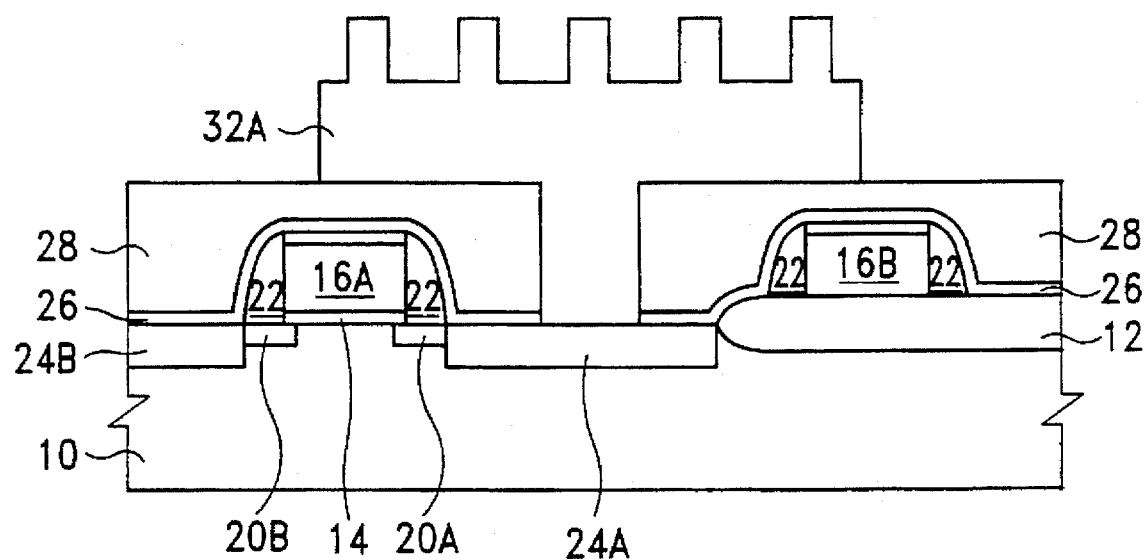

FIGS. 6 and 7 shows cross-section views of the final stage of one embodiment of the present invention. The second polysilicon layer 32 with a toothed-shape is masked by a patterned photoresist layer 40 as shown in the FIG. 6. Then, the second polysilicon layer 32 uncovered by the patterned photoresist layer 40 is removed. An etching process is performed to remove the second polysilicon layer 32. In this embodiment, the etching process can be performed any suitable etching process. Preferably, a reactive ion etching process is performed to etch the second polysilicon layer 32. The second dielectric layer 28 serves as an end-point of the etching process. Then a toothed-shape capacitor node 32A is formed. The resulting structure is shown in the FIG. 7.

Although specific embodiment has been illustrated and described, it will be obvious to those skilled in the art that various modifications may be made without departing from the which is intended to be limited solely by the appended claims.

The embodiments of the invention in which an exclusive property or privilege is claimed are defined as follows:

1. A method for forming a toothed-shaped capacitor node on a semiconductor substrate, said method comprising:

forming a polysilicon layer over said semiconductor substrate;

forming a dielectric layer on said polysilicon layer;

forming dot silicon on said dielectric layer;

removing said dielectric layer left uncovered by said dot polysilicon;

oxidizing said dot silicon and said polysilicon layer uncovered by said second dielectric layer to form a poly-oxide layer;

removing said poly-oxide layer to form trenches in said polysilicon layer;

removing said dielectric layer; and patterning and etching said polysilicon layer to form a capacitor node.

2. The method according to claim 1, wherein said polysilicon layer is a doped polysilicon layer.

3. The method according to claim 1, wherein said polysilicon layer has a thickness in a range of about 3000 to 8000 angstroms.

4. The method according to claim 1, wherein said dielectric layer is a nitride layer.

5. The method according to claim 1, wherein said dielectric layer has a thickness of a range of about 100 to 400 angstroms.

6. The method according to claim 1, wherein said dot silicon comprises Hemi-Spherical Grain polysilicon.

7. The method according to claim 1, wherein said dot silicon comprises single crystal silicon.

8. The method according to claim 1, wherein said dot silicon has a diameter of a range of about 50 to 500 angstroms.

9. The method according to claim 1, wherein said dot silicon has a space of a range of about 100 to 1000 angstroms.

10. The method according to claim 1, wherein removing said dielectric layer is removed by using an etching process with an oxide etchant.

11. The method according to claim 1, wherein said poly-oxide layer has a thickness of a range of about 2000 to 7000 angstroms on said polysilicon layer.

12. The method according to claim 1, wherein removing said poly-oxide layer is done by an etching process.

13. The method according to claim 1, wherein removing said dielectric layer is done by an etching process.

14. The method according to claim 1, wherein said trenches in said polysilicon layer have a depth of a range of about 1000 to 4000 angstroms.

15. A method for forming toothed-shaped capacitor node on a semiconductor substrate, said method comprising the steps of:

forming a polysilicon layer over said semiconductor substrate;

forming a dielectric layer on said polysilicon layer;

forming dot silicon on said dielectric layer;

etching said dielectric layer left uncovered by said dot silicon until the polysilicon layer is reached;

oxidizing said polysilicon layer uncovered by said dielectric layer to form a poly-oxide layer;

removing said poly-oxide layer to form trenches in said polysilicon layer;

removing said dielectric layer; and patterning and etching said polysilicon layer to form a capacitor node.

16. The method of claim 15 wherein said dot silicon is oxidized with said polysilicon layer and is removed with said poly-oxide layer.

17. The method of claim 15 wherein said dielectric layer is a nitride.

* * * * *